United States Patent [19]

Vivio

[11] Patent Number: 5,460,531
[45] Date of Patent: Oct. 24, 1995

[54] ADAPTOR CARD WITH PASS-THROUGH AND NON PASS-THROUGH VIAS

[75] Inventor: Joseph A. Vivio, Austin, Tex.

[73] Assignee: Dell USA, L.P., Austin, Tex.

[21] Appl. No.: 187,927

[22] Filed: Jan. 27, 1994

[51] Int. Cl.$^6$ .................................................. H01L 23/52
[52] U.S. Cl. .................................................. 439/70; 439/75
[58] Field of Search ................................ 439/68, 70, 75, 439/516

[56] References Cited

U.S. PATENT DOCUMENTS

| | | | |
|---|---|---|---|
| 3,340,439 | 9/1967 | Henschen et al. | 439/75 X |
| 3,568,001 | 3/1971 | Straus | 439/75 X |
| 4,516,816 | 5/1985 | Winthrop | 439/70 |
| 4,912,401 | 3/1990 | Nady, II et al. | 439/68 X |

Primary Examiner—Kenneth J. Ramsey
Attorney, Agent, or Firm—Kevin Daffer; James Huffman

[57] ABSTRACT

An interconnect structure is provided for converting or adapting select signals sent between a printed circuit board (PCB) and an electrical component. The interconnect structure comprises an adapter card placed between the PCB and the electrical component, wherein the adapter card includes one or more pass-through vias and non pass-through vias extending completely through the adapter card in parallel spaced relation to one another. Pass-through vias are used to couple signals having critical timing paths between the electrical component and the PCB without substantially modifying or changing the critical path switch points. The pass-through vias also provide connection of signals of non critical timing between the PCB and the component. A signal converter may be used to convert non-critical signals and place those signals at select pins upon the electrical component. Thus, the adapter card is well suited for providing conversion to newer, updated components which are pin-for-pin compatible with, and which operate at dissimilar voltages from, older components. The adapter card performs all necessary signal conversion without requiring modification to the larger PCB.

20 Claims, 4 Drawing Sheets

ADAPTOR CARD WITH PASS-THROUGH AND NON PASS-THROUGH VIAS

BACKGROUND OF THE INVENTION

1. Field of the Invention

This invention relates to an interconnect structure and more particularly to an adaptor card for interconnecting signals sent between a printed circuit board and an electrical component, and for converting or adapting select said signals sent therebetween.

2. Background of the Relevant Art

Printed circuit boards (PCBs) or printed wiring boards (PWBs) are rigid or flexible single, double or multilayered boards having printed conductors placed upon or within the board material. A PCB is designed to receive separately manufactured electrical components and to interconnect those components into an overall circuit structure. The components or parts comprise integrated or discrete circuits well known in the semiconductor art.

Many PCBs are manufactured by the subtractive process from rigid copper-clad epoxy-impregnated glass fiber laminate. The copper-clad foil is selectively removed leaving the desired conductive paths and pads on the insulating base material. PCBs can, alternatively, be fabricated by the additive process in which the desired conductive paths and pads are selectively added by copper plating on a chemical prepared base material. PCBs can also be fabricated from rigid phenolic-impregnated paper. The process may include screening resist patterns on the substrate rather than using photolithography. Regardless of the base material used or the process in which printed conductors are formed, the desired outcome of PCB manufacture remains the same: to produce a dielectric structure having densely patterned printed wires arranged upon the dielectric outer surface or at one or more levels within the dielectric. The overall structure provides a highly reliable mechanical and electrical support for electrical components arranged thereon.

A major disadvantage of PCBs is their non-adaptability. Any changes made to the PCB requires a change in artwork or mask from which the PCB is derived. Accordingly, it is imperative that once a PCB is designed (i.e., once the artwork for the printed conductors, plated-through holes and/or metal eyelets is formed), any rework or modification to the PCB layout must be avoided.

Unfortunately, however, there are many instances in which changes to the overall circuit, comprising PCB and overlying components, cannot be avoided. Changes made to the electrical component pin-out or component functionality generally forces a change in the interconnect routing to the component. If an "updated" component is to be retrofitted to an existing component area upon the PCB, then changes to the PCB may be necessary to accommodate the newer component.

Instead of discarding the previous PCB and re-tooling a new or updated PCB, many manufacturers have devised a more convenient and less expensive way in which to modify PCB interconnect using what is often called a "daughterboard" or adaptor card. An adaptor card is designed to be placed between the "motherboard" PCB and the electrical component. Changes to board interconnect occur entirely upon the smaller adaptor card instead of the larger PCB. An adaptor card can be surface mounted to a larger PCB using wave solder techniques. Alternatively, an adaptor card can be "plugged" into sockets arranged upon the PCB, and the electrical component can be surface mounted or plugged into the adaptor card. Any modifications to the component pin-out, modifications to signals sent to and from the component, or modifications to the operating characteristics of the component can be compensated for entirely within the adaptor card. Thus, an advantage of using an adaptor card is the benefit of avoiding rework of the larger PCB whenever component changes (i.e., changes in component function or layout) occur.

An exemplary adaptor card and arrangement of an adaptor card coupled between an electrical component and a PCB is illustrated in the prior art design shown in FIG. 1. Interconnect structure 10 is shown interconnecting signals sent between PCB 12 and component 14. Structure 10 comprises an adaptor card 16 electrically and mechanically coupled between PCB 12 and component 14. A plurality of board sockets 18 are arranged within one surface of PCB 12 and are used to mechanically receive plugs 20 aligned therewith. Once plugs 20 and sockets 18 are mated together, electrical connection is formed between printed conductors 22 within PCB 12 and printed conductors 24 within adaptor card 16. Any modifications to interconnect layout between PCB 12 and component 14 can be effectuated entirely within printed conductors 24 instead of printed conductors 22. Moreover, changes in the signal timing or signal level within one or more interconnect paths can be made by component 26 retrofitted on card 16 instead of on PCB 12.

Component 26 is any component which adapts or modifies signals sent across conductors 24 or conductors 22. Component 26 is sometimes necessary when interfacing an existing PCB 12 with a modified or revised component 14 (i.e., component 14 revised beyond that which the original PCB did not take into account). In many instances, component 14 may undergo numerous revisions, such as in the MPU (or CPU) field. Changes to component 14 may require PCB 12 to include a versatile socket 18 configuration, and adaptor card 16 to also include sockets 28 which can be used to receive plugs 20 and 30, respectively. Revisions to component 14 which do not change the pin-for-pin compatibility can be performed by removing the older version component 14 and replacing it in the field (in a plug and socket arrangement) with a newer version. If substantial changes have been made to the newer version component, then a new adaptor card 16 may be needed. However, the new adaptor card can remain pin-for-pin compatible with socket layout 18 such that a new PCB 12 is not required. All the expense of rework thereby remains in the change out of the adaptor card instead of the larger PCB 12.

An unfortunate aspect of conventional adaptor card 16 is the lateral displacement between sockets 28 and plugs 20. Not only does the lateral displacement consume valuable printed board area, but it also forces re-routing of signals across contorted paths formed by conductors 24. If the signals are critical timing signals, then any added length of conductors carrying those signals can change the corresponding timing configuration and switch points of the overall electronic system. High inductance within card 16 and the added conductor length may inject undue transient voltages to signals carried within conductors 24. If component 14 is a high speed MPU device, such as an Intel Corporation ix486 or Pentium® processor, then any change in switch points or voltage transient conditions on high speed critical paths can adversely affect MPU operation. It is therefore important in many applications to closely monitor and control the length of printed conductors 24 upon adaptor card 16.

If changes to component 14 allows the newer version to be pin-for-pin compatible with the older version, then slight changes or adaptations to signals in non critical paths can be performed without the need for the laterally displaced card configuration shown in FIG. 1. Instead, it is desirable that in such instances the non critical paths be routed while the critical paths be simply passed through the adaptor card with uniform and minimal disturbance to the signals contained therein. It is important that any changes made to the critical paths be uniformly made—i.e., all the critical paths receive the same amount of added conductor length. By experiencing minimal and substantially identical added length (i.e., minimal and uniform added resistance, capacitance and inductance), the critical paths will not experience deleterious timing skews.

As defined herein, "critical paths" refer to paths which are non steady state, and are paths which are particularly sensitive to switch point deviations. Critical paths are ones which may carry data, address and/or control signals to and from, for example, an MPU component. Slight deviations in switch point or the timing of high or low signal states upon the critical paths can cause improper operations of circuits connected to the paths. Any field upgrade of component 14 or card 16 must be done without affecting, i.e., adding to or taking away from, the conductor lengths of the critical paths relative to each other.

SUMMARY OF THE INVENTION

The problems outlined above are in large part solved by an improved adaptor card of the present invention. That is, the adaptor card hereof utilizes pass-through and non pass-through vias aligned directly between sockets within a PCB and pins extending from an electrical component. The pass-through vias are all of equal length and advantageously connect all the critical paths arranged between the PCB and the component. Pass-through vias are relatively short and are generally less than one centimeter in length. Since all the pass-through vias are fairly short, minimal resistance, capacitance and inductance is added to the critical path signals. Moreover, since all of the pass-through vias are the same length, any added resistance, capacitance and inductance will be placed uniformly upon each path to avoid skewing switch points and adversely affecting component operation.

The improved adaptor card is well suited for replacing older version electrical components with newer version components, wherein the updated component pins have critical path signals which are pin-for-pin compatible with the older component pins. Any changes in the non critical path conductors are selectively performed on the adaptor card between the pass-through vias and non pass-through vias. The non pass-through vias, like the pass-through vias, include a socket at one end of the vias for receiving component pins. The non pass-through vias, however, do not include elongated plugs extending at ends opposite the via sockets. The non pass-through vias, absent elongated plugs, purposefully do not make connection to underlying PCB and therefore can maintain the altered or adapted status of the non critical signals routed thereto.

By utilizing pass-through vias and non pass-through vias upon an adaptor card, the present interconnect configuration can achieve signal modification of non critical signals on the adaptor card without need for modifying the larger PCB. Moreover, field upgrades may, in some instances, be performed by simply plugging the component pins into the pass-through and non pass-through sockets configured within the adaptor card. Additional modifications or alterations, if necessary, can be performed entirely upon the adaptor card using the existing socket configuration. Thus, non critical signals can be adapted or modified by changes in layout of printed conductors upon the adaptor card and/or by changes in, or the addition of, adaptor components arranged upon the adaptor card.

Broadly speaking, the present invention contemplates an adapter card. The adapter card comprises a dielectric structure having a pair of opposing surfaces. A pass-through via and an non pass-through via extend through the dielectric structure in a straight line perpendicular to the opposing surfaces. The pass-through via comprises a pass-through socket at one end of the pass-through via and a pass-through plug at the opposite end of the pass-through via. The non pass-through via comprises a non pass-through socket at one end of the non pass-through via and a non pass-through plug at the opposite end of the non pass-through via. The non pass-through plug extends from one of the pair of opposing surfaces a lesser distance than the pass-through plug. The adapter card may further include a signal converter connected to the dielectric structure and electrically coupled between the pass-through via and the non pass-through via. The signal converter is adapted for receiving a signal from the pass-through via and for converting the signal and routing the converted signal to a non pass-through via. The signal comprises a non-critical timing signal and, preferably, comprises a steady state voltage level, wherein the signal converter is adapted for convening the voltage level to a dissimilar voltage level.

The present invention further contemplates an interconnect structure for adapting a signal sent between a printed circuit board and an integrated circuit. The interconnect structure comprises a printed circuit board (PCB) having a plurality of conductors arranged within the PCB and a plurality of board sockets electrically connected to one end of the conductors. The interconnect structure further comprises an adapter card having a plurality of pass-through vias and non pass-through vias. The plurality of pass-through vias are mechanically and electrically connected to respective plurality of board sockets. The plurality of non pass-through vias are purposefully spaced from respective plurality of board sockets. An integrated circuit is provided having a plurality of pins connected to respective plurality of pass-through and non pass-through vias. A signal converter is configured upon the adapter card and is electrically coupled between at least one of the plurality of pass-through vias and at least one of the plurality of non pass-through vias. The signal converter is adapted for receiving a signal from the pass-through vias and for convening the signal and routing the converted signal to the non pass-through vias.

The pass-through vias and non pass-through vias defined herein are configured within openings placed through the adapter card. The pass-through vias and non pass-through vias extend through the openings in a straight line perpendicular to opposing surfaces of the adapter card. The pass-through vias and non pass-through vias are configured within the openings in parallel spaced relation to one another. Each of the pass-through vias is further configured in direct alignment between one of the plurality of integrated circuit pins and one of the plurality of board sockets. Each of the non pass-through vias is configured in direct alignment between one of the plurality of integrated circuit pins and is in aligned spaced relation to one of the plurality of board sockets. At least one of the pass-through vias is adapted for electrical coupling to a conductor embedded within the PCB. Alternatively, at least one of the pass-through vias is adapted for electrical coupling to a fly wire routed from the printed circuit board.

BRIEF DESCRIPTION OF THE DRAWINGS

Other objects and advantages of the invention will become apparent upon reading the following detailed description and upon reference to accompanying drawings in which.

Figure 1:
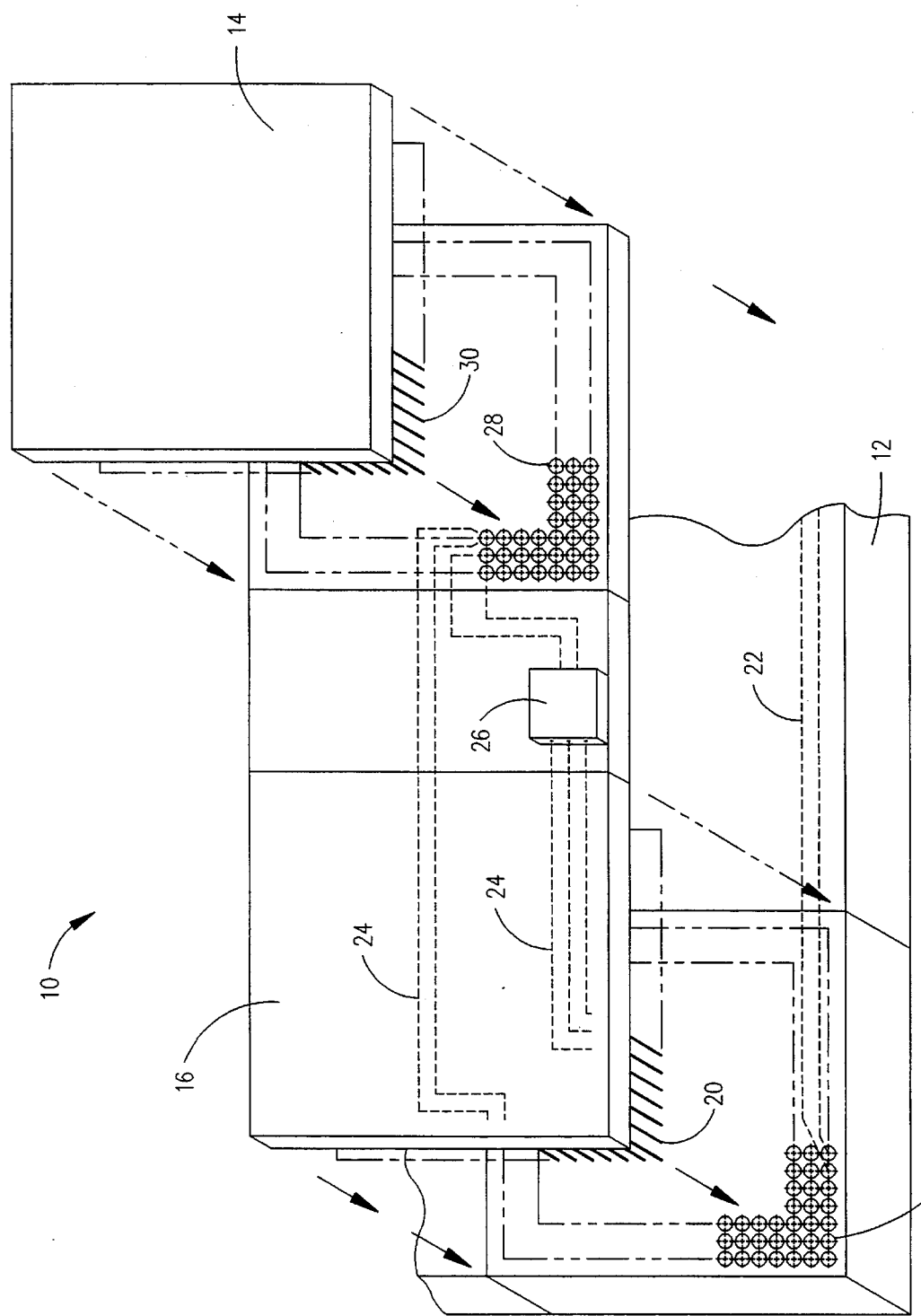
FIG. 1 is a perspective view of an interconnect structure according to a prior design.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 2:
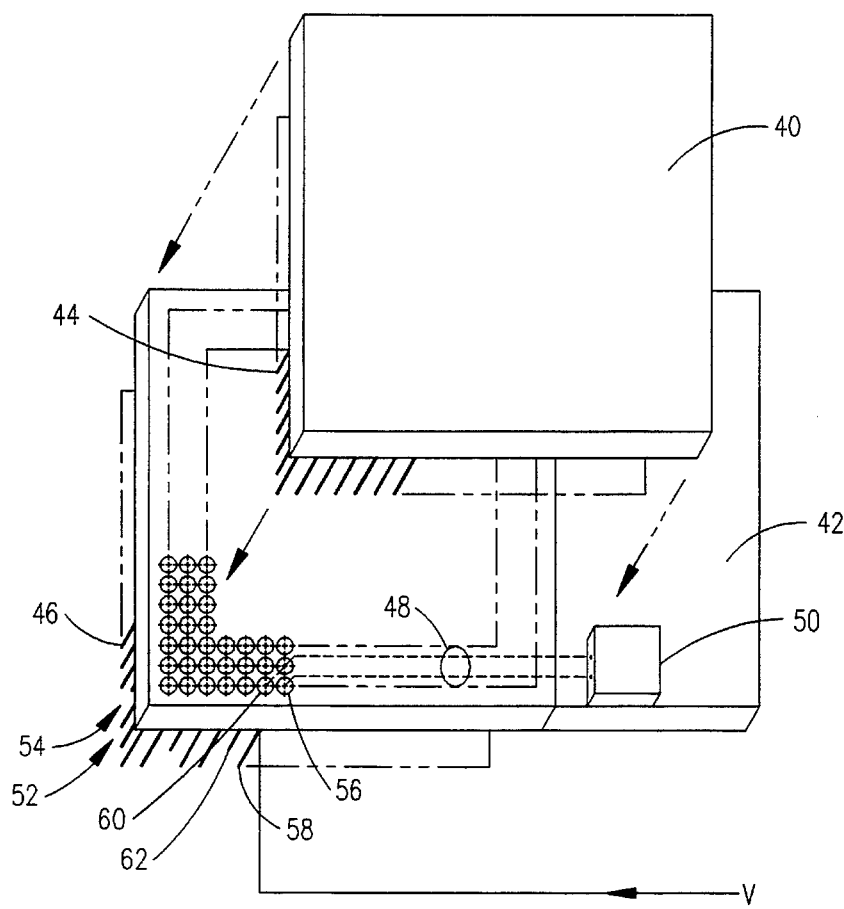
FIG. 2 is a perspective view of an electrical component placeable upon an adapter card with interconnect routing therebetween according to an exemplary embodiment of the present invention.

Turning now to FIG. 2, a perspective view of an electrical component 40 is shown placeable upon an adapter card 42 to form an interconnect routing according to an exemplary embodiment of the present invention. Adapter card 42 is advantageously configured of smaller size than many conventional adapter cards. Adapter card 42 is sized large enough to accommodate laterally displaced conductors carrying only non-critical signals. Any critical signal is passed through the card directly between a PCB and component 40. Thus, pins 44 upon component 40 align directly with underlying pins 46 upon adapter card 42. By maintaining direct alignment between pins 44 and 46, pass-through is easily achieved with minimal, uniform length added to conductors embodying critical signal paths. All non-critical signals are sent through laterally configured wires (printed or fly wires) 48 to and from, for example, a signal converter component 50.

Pass-through and non pass-through of select signals, based upon whether those signals are critical timing signals, is achieved using appropriately placed pass-through vias 52 and non pass-through vias 54. All of the pass-through vias 52 are of equal length, and all non pass-through vias 54 are of equal length, the pass-through vias 52 being of longer length than non pass-through vias 54. Each pass-through via and each non pass-through via extends entirely through adapter card 42 in a straight line perpendicular to the opposing surfaces of card 42. At the distal ends of each pass-through via 52 is a pass-through socket 56 and a pass-through plug 58. Likewise, at distal ends of each non pass-through via 54 is a non pass-through socket 60 and non pass-through plug 62. The non pass-through plug 62 is suitably sized to prevent electrical conduction to an underlying socket contained within, for example, a PCB. Thus, plug 62 is spaced above the underlying PCB to prevent electrical connection thereto. Pass-through plug 58, however, does maintain electrical connection to the underlying PCB and can be used to receive and pass-through critical signals to a corresponding pin 44 mated into pass-through socket 56. Pass-through plug 58 is also used to receive electrical connection from a non-critical signal. Pass-through plug 58, shown in FIG. 2, receives signal V and transfers that signal to pass-through socket 56, where it is then laterally transferred into signal converter 50 by conductor 48. Conductor 48 then receives output from converter 50 and routes the converted signal to a non pass-through socket 60. Non pass-through socket 60 allows connection to a respective pin 44 of component 40 but, due to the shortened stature of non pass-through plug 62, prevents connection to an underlying PCB.

Non-critical signal V can, for example, be a steady state voltage signal used for powering component 40. Signal V can be converted or adapted by routing the signal to converter 50 which then converts or changes the voltage level of signal V to be compatible with a newer version component 40 coupled to adapter card 42. Thus, adapter card 42 is well suited for converting a voltage signal placed upon a pass-through via 52 and for routing the converted voltage signal to one of more non pass-through vias 54. The converted voltage at non pass-through vias 54 allow operability to newer version, lower operating voltage electrical components 40 which replace older version, higher voltage components. With recent advances in lower voltage MPU circuits, a need arises for making those circuits compatible with pre-existing PCBs without having to rework the PCB or voltage supply components arranged upon the PCB. Adapter card 42 advantageously provides necessary adaptation to lower voltage MPUs such as, for example, high speed Intel Corporation ix486 or Pentium® processors. Older processors generally operate at 5 volt levels, whereas newer processors achieve higher speed by, inter alia, operating at voltages less than 5 volts, and preferably within the 3 to 3.5 volt range. Other than operating voltage dissimilarities, many upgraded or updated processors, however, remain pin-for-pin compatible with older version processors. Adapter card 42 not only maintains the pin compatibility to updated processors, but also provides steady state signal or voltage conversion to newer, high speed voltage levels.

Figure 2A:
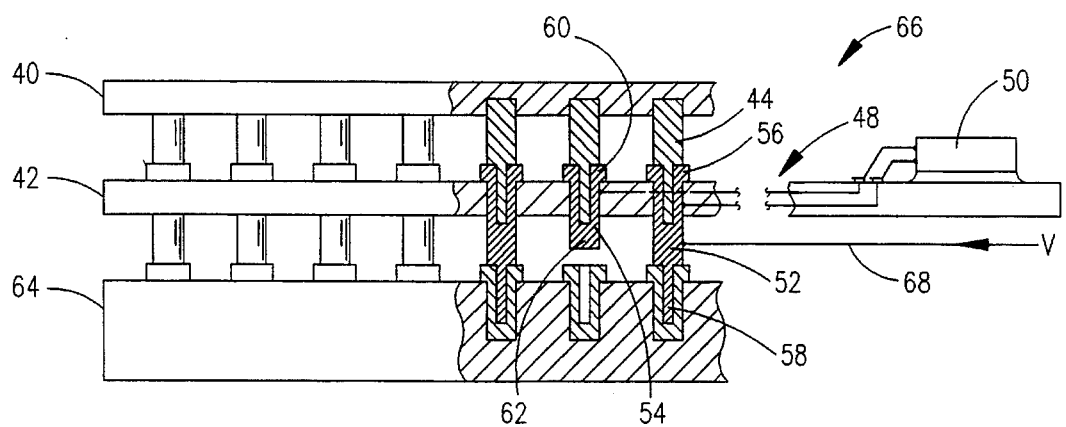
FIG. 2A is a side elevational view in partial cross-section of an adapter card placed between a printed circuit board (PCB) and an electrical component to form an interconnect structure according to the embodiment of FIG. 2.
Figure 3:
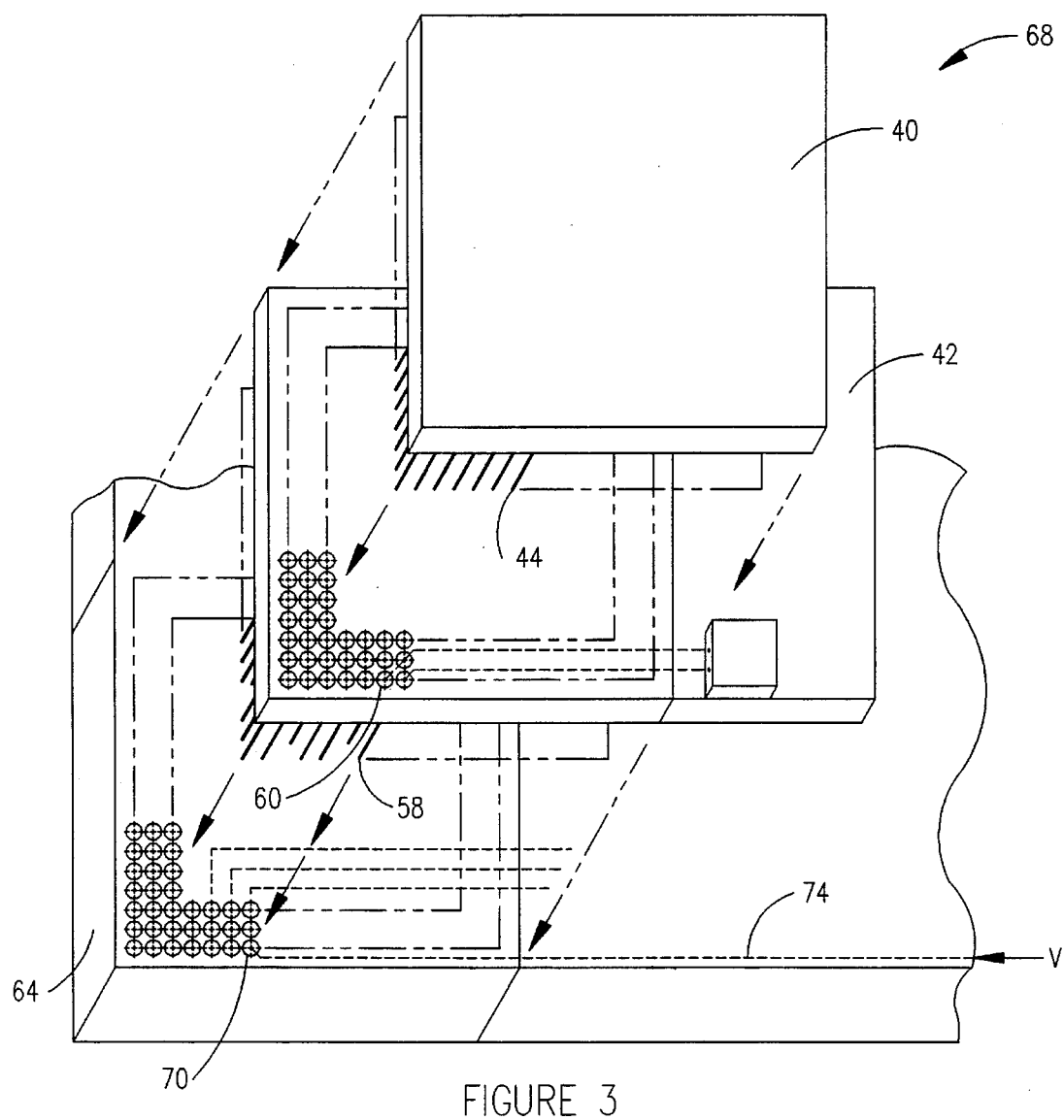
FIG. 3 is a perspective view of an electrical component placeable upon an adapter card with interconnect routing therebetween according to another exemplary embodiment of the present invention.
Figure 3A:
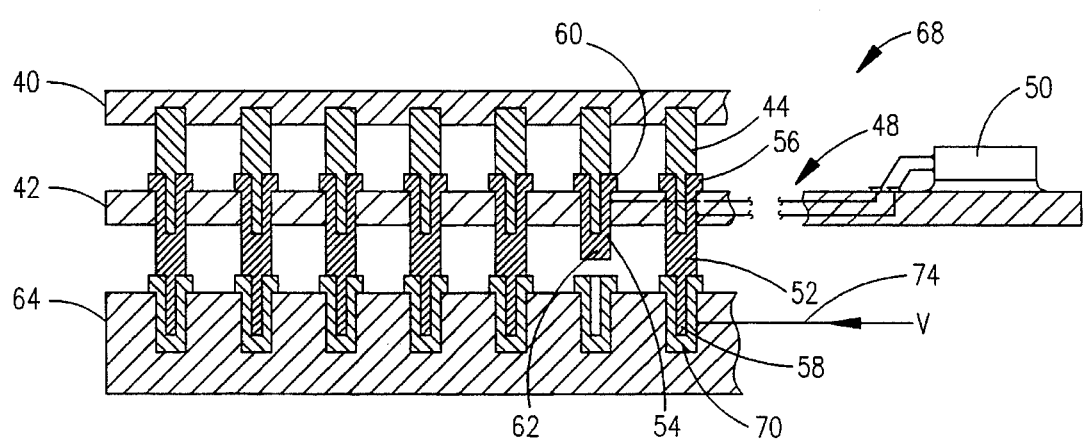
FIG. 3A is a side elevational view in cross-section of an adapter card placed between a PCB and an electrical component to form an interconnect structure according to the embodiment of FIG. 3.

Referring now to FIG. 2A, a side elevational view in partial cross-section of adapter card 42 is shown coupled between PCB 64 and electrical component 40 to form an interconnect structure 66. Interconnect structure 66 is illustrative of an exemplary embodiment by which signal V is routed to pass-through via 52. Another exemplary embodiment by which signal V is routed to pass-through via 52 is illustrated in FIGS. 3 and 3A described herein below. Signal V can be routed from a component or conductive pad placed somewhere upon PCB 64 by a fly wire 68 connected between the component or pad (not shown) and the upper portion of pass-through plug 58. The point of connection can be either a solder connection or, alternatively, can be a wire wrap connection. In either case, signal V can be routed easily and quickly from it origination point to the pass-through plug 58. Pass-through plug 58 thereby transfers signal V to conductors 48 connected to pass-through via 52, as shown. Conductors 48 laterally route signal V to signal converter 50, where signal V is then converted to its necessary, compatible steady state level for operation of an updated, possibly lower operating voltage component 40. Component 40 is adapted to receive the converted signal at select pins 44, wherein pin 44 provides the necessary steady state level for operation of newer version, high speed processors.

Referring now to FIG. 3, an alternate interconnect structure 68 is shown having signal V routed in a printed wire 74 within PCB 64 instead of over a fly wire. Signal V is therefore shown as a signal transferred within conductors embedded within PCB 64 and is electrically connected to one or more PCB sockets 70. PCB socket 70 is adapted to receive pass-through plug 58 in order to transfer signal V from PCB 64 to adapter card 42. Adapter card 42 can then convert signal V and present the converted signal back to non pass-through socket 60. Non pass-through socket 60 allows connection of the converted signal V to a corresponding pin location 44 without transferring the converted signal back to a corresponding socket upon PCB 64. Similar to the embodiment of FIG. 2, the embodiment of FIG. 3 provides interconnect routing of signal V to and from signal converter 50 and also provides pass-through of non-converted critical signals. The embodiment of FIG. 3 illustrates that any and all modifications necessary for signal conversion and pass-through function can be performed entirely upon adapter card 42 while utilizing pre-existing printed wire layout upon PCB 64. Fly wire alterations to PCB layout are not necessary in the exemplary embodiment shown in FIG. 3.

Referring now to FIG. 3A, a side elevational view in cross-section of the embodiment of FIG. 3 is illustrated. In particular, interconnect structure 68 is shown having signal V transferred across embedded printed wires 74 within PCB 64. Signal V is electrically coupled according to normal printed wire/eyelet interface to socket 70 formed within PCB 64. Socket 70 thereby provides transfer of signal V to pass-through via 52, and printed conductors 48 allow transfer between pass-through via 52 and non pass-through via 54.

Figure 4:
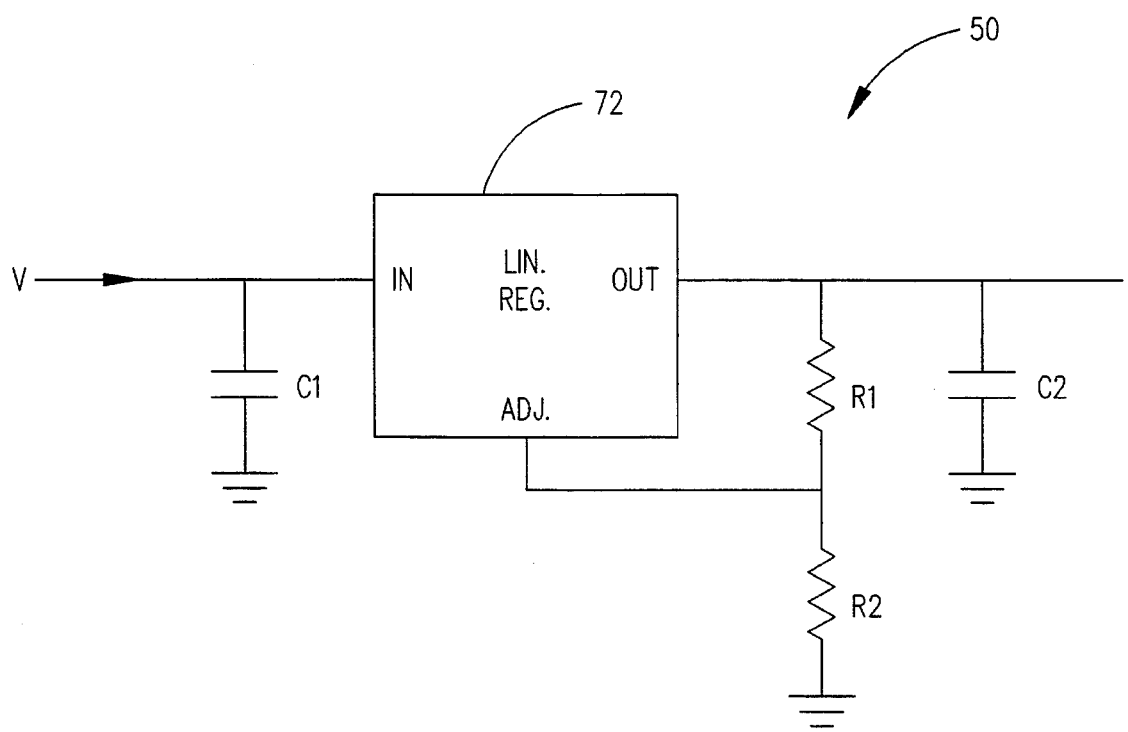
FIG. 4 is a circuit schematic of a signal converter placeable upon the adapter card of the present invention.

Referring now to FIG. 4, a circuit schematic of signal converter 50 is illustrated according to an exemplary embodiment of the present invention. It is understood that signal converter 50 includes any converter which adapts or converts a non-critical signal necessary for operation of a revised or updated component 40 which replaces an older component. An exemplary signal converter includes one which converts the voltage level of signal V to a dissimilar voltage level. In such a case, a linear regulator 72 can be used to perform the conversion. A suitable linear regulator can be obtained from Linear Technology Corp., Milpitas, Calif., Part No. LT1086. Linear regulator 72 is coupled between an input bypass capacitor C1 and an output capacitor C2. Exemplary values for capacitors C1 and C2 necessary to covert a 5 volt signal V to a 3.3 volt output includes 10 µf and 100 µf, respectively. Regulator 72 can be adjusted by a voltage divider network comprising resistors R1 and R2. Resistors R1 necessary for 5 volt to 3.3 volt conversion are 121 ohm and 200 ohm, respectively.

Using the component values set forth above and linear regulator Part No. LT1086, a 5 volt to a 3.3 volt conversion of signal V can be achieved. The 5 to 3 volt conversion is but one example of conversion necessary for operating newer version, low voltage microprocessors within pre-existing PCBs. Thus, the configuration of FIG. 4 provides complete retrofitability to lower voltage, higher speed processors without having to modify the PCB and without having to change the pre-existing socket configuration upon the PCB. Thus, adapter card 42 is well suited for performing the voltage conversion for newer version pin-compatible MPUs using pre-existing computers and computer PCBs.

It will be appreciated to those skilled in the art having the benefit of this disclosure that this invention is capable of applications with numerous types of PCBs and with numerous types of electrical components. Furthermore, it is to be understood that the form of the invention shown and described is to be taken as presently preferred embodiments. Various modifications and changes may be made without departing from the spirit and scope of the invention as set forth in the claims. It is intended that the following claims be interpreted to embrace all such modifications and changes and, accordingly, the specification and drawings are to be regarded in an illustrative rather than a restrictive sense.

What is claimed is:

1. An adaptor card, comprising:
   a dielectric structure having a pair of opposing surfaces; and
   a pass-through via and a non pass-through via, each extending through said structure in a straight line perpendicular to said opposing surfaces, said pass-through via comprises a pass-through socket at one end of said pass-through via and a pass-through plug at the opposite end of said pass-through via, said non pass-through via comprises a non pass-through socket at one end of said non pass-through via and a non pass-through plug at the opposite end of said non pass-through via, wherein said non pass-through plug extends from one of said pair of opposing surfaces a lesser distance than said pass-through plug.

2. The adaptor card as recited in claim 1, further comprising:
   a signal converter connected to said dielectric structure and electrically coupled between said pass-through via and said non pass-through via.

3. The adaptor card as recited in claim 2, wherein said signal converter is adapted for receiving a signal from said pass-through via and for converting said signal and routing said converted signal to said non pass-through via.

4. The adaptor card as recited in claim 3, wherein said signal comprises a non-critical timing signal.

5. The adaptor card as recited in claim 3, wherein said signal comprises a steady state voltage level, and said signal converter is adapted for converting said voltage level to a dissimilar voltage level.

6. The adaptor card as recited in claim 1, wherein said pass-through via and said non passe through via extend through said structure in parallel spaced relation to one another.

7. The adaptor card as recited in claim 1, wherein said pass-through plug is adapted for mechanical coupling to a printed circuit board and for electrical coupling to a conductor embedded within said board.

8. The adaptor card as recited in claim 1, wherein said pass-through plug is adapted for mechanical coupling to a printed circuit board and for electrical coupling to a fly wire routed from said board.

9. The adaptor card as recited in claim 1, wherein the distal end of said non pass-through plug is spaced from a printed circuit board outer surface during times in which said pass-through plug is inserted into said board.

10. An interconnect structure for adapting a signal sent between a printed circuit board and an integrated circuit comprising:

a printed circuit board comprising a plurality of conductors arranged within said board and a plurality of board sockets electrically connected to one end of said conductors;

an adaptor card comprising a plurality of pass-through vias and non pass-through vias, wherein said plurality of pass-through vias are mechanically and electrically connected to respective said plurality of board sockets, and wherein said plurality of non pass-through vias are spaced from respective said plurality of board sockets;

an integrated circuit comprising a plurality of pins connected to respective said plurality of pass-through and non pass-through vias; and a signal converter configured upon said adaptor card and electrically coupled between at least one of said plurality of pass-through vias and at least one of said plurality of non pass-through vias, wherein said signal converter is adapted for receiving a signal from said pass-through vias and for converting said signal and routing said converted signal to said non pass-through vias.

11. The interconnect structure as recited in claim 10, wherein said integrated circuit is hermetically sealed within a pin-grid array package comprising said plurality of pins extending from one surface of said package.

12. The interconnect structure as recited in claim 10, wherein said pass-through vias and non pass-through vias are configured within openings placed through said adaptor card, whereby said pass-through vias and non pass-through vias extend through said openings in a straight line perpendicular to opposing surfaces of said card.

13. The interconnect structure as recited in claim 12, wherein said pass-through vias and non pass-through vias are configured within said openings in parallel spaced relation to one another.

14. The interconnect structure as recited in claim 10, wherein each said pass-through via is in direct alignment between one of said plurality of integrated circuit pins and one of said plurality of board sockets, and wherein each of said non pass-through via is in direct alignment between one of said plurality of integrated circuit pins and a spaced one of said plurality of board sockets.

15. The interconnect structure as recited in claim 10, wherein at least one of said pass-through vias is adapted for electrical coupling to a conductor embedded within said printed circuit board.

16. The interconnect structure as recited in claim 10, wherein at least one of said pass-through vias is adapted for electrical coupling to a fly wire routed from said printed circuit board.

17. The interconnect structure as recited in claim 10, wherein said signal comprises a noncritical timing signal.

18. The interconnect structure as recited in claim 10, wherein said signal comprises a steady state voltage level, and said signal converter is adapted for converting said voltage level to a dissimilar voltage level.

19. The interconnect structure as recited in claim 10, wherein said signal comprises a steady state voltage level, and said signal converter comprises a linear regulator placed between a pair of capacitors for converting said voltage level to a lesser voltage level.

20. An interconnect structure for converting a voltage signal upon a printed conductor within a printed circuit board to a lesser voltage level sent to an integrated circuit, comprising:

a printed circuit board comprising a plurality of primed conductors and a plurality of board sockets electrically connected to one end of said conductors, wherein said conductors are adapted to receive a voltage signal;

an integrated circuit hermetically sealed within a pin-grid array package comprising a plurality of pins extending from one surface of said package and electrically connected to said integrated circuit;

an adaptor card comprising a plurality of openings arranged through opposing surfaces of said card in direct alignment between said board sockets and said integrated circuit pin, wherein said openings are configured to receive pass-through vias and non pass-through vias which extend in parallel spaced relation to each other through said openings in a straight line perpendicular to said opposing surfaces;

a select one of said plurality of pass-through vias is coupled between one of said plurality of integrated circuit pins and one of said plurality of board sockets to receive said voltage signal; and a signal converter configured upon said adaptor card and electrically coupled between said select one of the pass-through vias and at least one of said plurality of non pass-through vias, wherein said signal converter is adapted for receiving said voltage signal from said pass-through via and for converting said signal to a lesser voltage level and for routing said converted signal to said non pass-through vias, wherein said non pass-through vias are coupled to respective plurality of integrated circuit pins to complete the connection of said voltage signal and converted voltage signal from said printed conductor to said integrated circuit.

* * * * *